United States Patent
Sakata

[19]

[11] Patent Number: 5,847,415

[45] Date of Patent: Dec. 8, 1998

[54] LIGHT EMITTING DEVICE HAVING CURRENT BLOCKING STRUCTURE

[75] Inventor: Yasutaka Sakata, Tokyo, Japan

[73] Assignee: NEC Corporation, Tokyo, Japan

[21] Appl. No.: 626,074

[22] Filed: Apr. 1, 1996

[30] Foreign Application Priority Data

Mar. 31, 1995 [JP] Japan .................................. 7-075103

[51] Int. Cl.$^6$ .................................................. H01L 33/00
[52] U.S. Cl. .............................. 257/96; 257/102; 372/46
[58] Field of Search .......................... 257/14, 94, 96, 257/102; 372/45, 46

[56] References Cited

U.S. PATENT DOCUMENTS

| 4,849,372 | 7/1989 | Takemoto | 372/46 |
| 5,111,471 | 5/1992 | Hattori | 372/46 |

FOREIGN PATENT DOCUMENTS

| 6125131 | 5/1994 | Japan . |
| 06338654A | 12/1994 | Japan . |

OTHER PUBLICATIONS

T. Kato et al, "2.5 GB/S Modulation Characteristics of DFB–LD/Modulator Integrated Light Source Fabricated by Selective MOVPE", *The Institute of Electronics, Information and Communication Engineers,* 1993, Autumn Congress, C–98, pp. 4–178 w/partial English translation.

K. Uomi et al, "Low Threshold Current (<1mA) Operation of 1.3 $\mu$m Strained–MQW CBPBH Lasers", *The Institute of Electronics, Information and Communication Engineers,* 1994, Vernal Congress, C–213, pp. 4–210 w/partial English translation.

K. Uomi et al, "Extremely Low Threshold (0.56 mA) Operation in 1.3 $\mu$m InGaAsP/InP Compressive–Strained MQW Lasers", *Electronics Letters,* 24 Nov. 1994, vol. 30, No. 24, pp. 2037–2038.

T. Terakado et al, Submilliamp Threshold 1.3 $\mu$m Strained MQW Lasers with Novel P–Substrate Buried–Heterostructure Grown by MOVPE using TBA and TBP, *Electronics Letters,* 7th Dec. 1995, vol. 31, No. 25, pp. 2182–2183.

*Primary Examiner*—Minh-Loan Tran
*Attorney, Agent, or Firm*—Sughrue, Mion, Zinn, Macpeak & Seas, PLLC

[57] ABSTRACT

A pair of SiO$_2$ stripe masks are formed on a p-InP substrate (31) with a separation of 1.5 $\mu$m in [011] direction and an optical waveguide including a p-InP clad layer (32), an active layer (33) and an n-InP clad layer (34) is formed on the p-InP substrate (31) at the 1.5 $\mu$m exposed area according to MOVPE selective growth process. Both sides of the optical waveguide are buried with pnpn current blocking structure according to the MOVPE selective growth, wherein a p-InP layer (36) and n-InP layer (37) are formed, then a surface of the n-InP layer (37) is inverted to p-type to form a p-InP inversion layer (38) according to Zn open tube diffusion process carried out in MOVPE system, thereby the interconnection between the n-InP layer (37) and the n-InP clad layer (34) is prevented, and then a p-InP layer (39) and n-InP layer (40) are formed. An n-InP layer (41) is formed thereon.

12 Claims, 11 Drawing Sheets

LIGHT EMITTING DEVICE HAVING CURRENT BLOCKING STRUCTURE

FIELD OF THE INVENTION

The present invention relates to a buried heterostructure photosemiconductor device and a method of fabricating the same by using a selective growth for forming the active layer.

BACKGROUND OF THE INVENTION

In order to achieve the reduction of the threshold current and the high output in the semiconductor laser, it is indispensable to reduce the propagation loss of the wave guide and the leakage current (ineffective current) which flows through the portions other than the active area layer.

In the buried heterostructure (BH) laser, the p-n junction or high resistance semiconductor layer (Fe-doped, Ti-doped or the like) has conventionally been used as the layer for blocking current and, as an example of the BH laser using the p-substrate, there is one (first conventional device) reported by Uomi et al. in the Institute of Electronics, Information and Communication Engineers, 1994 Vernal Congress, C-213 (page 4–210) and in Electronics Letters, 24th Nov., 1994, Vol. 30, No. 24, Pages 2037–2038, and Kawano et al. proposed a similar structure in Japanese Patent Application Laid-open No. 6-125131 [125131/1994] (second conventional device). Further, a structure increasing the current blocking effect, which is substantially similar to the first and second conventional devices, is proposed by Terakado in Japanese Patent Application Laid-open No. 6338654 [338654/1994] and by Terakado, et al. in Electronics Letters, 7th Dec., 1995, Vol. 31, No. 25, Pages 2182–2184 (third conventional device).

The first and second conventional devices are hereinafter described with reference to FIGS. 1A to 1D, which are each a cross-sectional view for explaining the fabrication process. First, as shown in FIG. 1A, a p-InP clad layer 2, an active layer 3 and an n-InP clad layer 4 are epitaxially grown on a p-InP substrate 1 according to the metal-organic vapor phase epitaxy (MOVPE) process. Then, as shown in FIG. 1B, after a SiO$_2$ mask 14 is formed, a mesa-stripe structure is made by etching. Next, as shown in FIG. 1C, the lateral surface of the mesa-stripe is buried with a p-InP layer 5, n-InP layer 6, p-InP layer 7 and n-InP layer 8 by growth method to form a current blocking structure. Lastly, the SiO$_2$ mask 14 is removed and, after an n-InP layer 9 and n-InGaAsP cap layer 10 are buried flatly, as shown in FIG. 1D, a process of forming an insulation film 11 and electrodes 12, 13 is followed to form a laser structure.

Here, it is important to control the thickness of the p-InP layer 5 and the n-InP current blocking layer 6. That is, in order to avoid the interconnection between the n-InP current blocking layer 6 to the n-InP clad layer 4, when the p-InP layer 5 is grown, the thickness thereof must be controlled so that the (133) plane forming an angle of 76±5 degrees relative to the (100) plane emerges. Further, the n-InP current blocking layer 6 growing on the p-InP layer 5 needs to end its growth before reaching the uppermost portion of the mesa-stripe, i.e. before coming in contact with the SiO$_2$ mask film 14.

The above thickness control depends greatly on the width or depth of the mesa-stripe in the mesa etching process shown in FIG. 1B. Since the width and depth of the mesa-stripe are controlled by side etching the interface between the SiO$_2$ mask film 14 and the n-InP clad layer 4, the profile of the mesa-stripe obtained by etching is greatly changed depending on the adhesion between the SiO$_2$ film 14 and the n-InP clad layer 4, or quality of the SiO$_2$ film 14, or concentration or temperature of the etchant. Therefore, it is difficult to fabricate the optimum structure with excellent controllability and reproducibility and with good yield.

Next, the third conventional device is described with reference to FIGS. 2A to 2D. It is basically relevant to a structure and a method which are similar to the first and second conventional devices, but as shown in FIG. 2C, the current blocking structure is different in that an InGaAsP layer 7b is present. It becomes possible to reduce the lifetime of the hole injected into the gate of a pnpn thyristor structure forming the current blocking structure by realizing the radiative recombination at this InGaAsP layer 7b so that the turn-on action of the thyristor can be suppressed. Therefore, since the leak current can be suppressed also at a high temperature, the temperature characteristic of the oscillation threshold current is excellent. However, in the third conventional device, since the mesa-stripe structure including the active layer is formed by the etching process as in the fabrication of the first and second conventional device, it is difficult to fabricate the optimum structure with good controllability, reliability, repeatability and with good yield, as in the conventional devices.

Next, a conventional semiconductor laser which is fabricated according to the MOVPE selective growth method is shown, which is excellent in controllability and reproducibility because the optical waveguide can be made without etching the semiconductor layer. FIGS. 3A to 3D are each a cross-sectional view for explaining the fabrication process of an integrated optical semiconductor device (fourth conventional device) reported by Kato et al. in the Institute of Electronics, Information and Communication Engineers, 1993 Autumn Congress, C-98 (page 4–178). First, as shown in FIG. 3A, a pair of SiO$_2$ stripe masks 20 is formed on an n-InP substrate 21 in the direction of [011] with the separation of 1.5 to 2.0 $\mu$m. Next, as shown in FIG. 3B, an n-InP clad layer 22, active layer 23 and p-InP clad layer 24 are formed on the substrate 21 at the area between a pair of the SiO$_2$ masks 20 according to the MOVPE selective growth method. At this time, since the crystal surface of the (111)B plane is spontaneously formed as the lateral surface of the optical waveguide which is formed by the layers 22, 23, 24, the mesa stripe structure is fabricated very uniformly. Next, as shown in FIG. 3C, after a gap between the pair of SiO$_2$ masks 20 is widened, a p-InP layer 25 and p-InGaAs cap layer 26 are epitaxially grown on the substrate 21 and the layers 22, 23, 24 according to the MOVPE selective growth method. Finally, the process of forming an insulation film 27 and a pair of electrodes 28, 29 is carried out to obtain a laser structure as shown in FIG. 3D.

As described above, in the fourth conventional device, since the optical waveguide can be formed without etching the semiconductor layer, the semiconductor laser can be fabricated with excellent controllability and reproducibility and with good yield. However, since it is difficult to introduce the current blocking structure, the threshold current rises and optical output is saturated when a large current is injected. That is, this structure has been attended with such a problem that it is difficult to achieve the reduction of the laser oscillation threshold current and the high optical output.

SUMMARY OF THE INVENTION

In view of the foregoing circumstances, the present invention has been conceived, and its primary object is to provide a structure of the optical semiconductor device small in leakage current (ineffective current) and a method of fabricating the same, and its secondary object is to allow such a structure to be realized with good controllability and reliability or reproducibility and with high yield.

According to the present invention, there is provided a photosemiconductor device, comprising:

an optical waveguide formed on a first electrical conduction type semiconductor substrate; and a current blocking structure positioned adjacent to the optical waveguide, the current blocking structure comprising a first, first electrical conduction type semiconductor layer formed on the substrate, a second electrical conduction type semiconductor layer formed thereon, a first electrical conduction type inversion semiconductor layer which is obtained by inverting an electrical conduction type of a surface of the second electrical conduction type semiconductor layer, and a second, first electrical conduction type semiconductor layer formed thereon, wherein the first, first electrical conduction type semiconductor layer and the inversion semiconductor layer are in contact with each other, thereby the second electrical conduction type semiconductor layer is separated from the optical waveguide.

In an embodiment of the present invention, the optical waveguide comprises a first electrical conduction type clad layer formed on the substrate, an active layer formed thereon and a second electrical conduction type clad layer formed thereon.

According to the present invention, there is provided a photosemiconductor device, comprising:

a second electrical conduction type semiconductor layer formed on a first electrical conduction type semiconductor substrate;

a first electrical conduction type inversion semiconductor layer which is obtained by inverting an electrical conduction type of a partial area of the second electrical conduction type semiconductor layer;

an optical waveguide formed on the inversion semiconductor layer; and a current blocking structure positioned adjacent to the optical waveguide, the current blocking structure comprising the inversion semiconductor layer, the second electrical conduction type semiconductor layer and a first electrical conduction type semiconductor layer formed thereon, wherein the first electrical conduction type semiconductor layer and the inversion semiconductor layer are in contact with each other, thereby the second electrical conduction type semiconductor layer is separated from the optical waveguide.

In an embodiment of the present invention, the optical waveguide comprises a first electrical conduction type clad layer formed on the inversion semiconductor layer, an active layer formed thereon and a second electrical conduction type clad layer formed thereon.

According to the present invention, there is provided a photosemiconductor device, in which an optical waveguide containing an active layer is directly formed on a first electrical conduction type semiconductor substrate by selective growth; a lateral surface of the optical waveguide is buried with a semiconductor multilayer structure containing a first electrical conduction type semiconductor layer and a second electrical conduction type semiconductor layer; and a partial area of the second electrical conduction type semiconductor layer is inverted to a first electrical conduction type.

According to the present invention, there is provided a method of fabricating a photosemicoductor device, comprising steps of:

forming a pair of stripe masks on a first electrical conduction type semiconductor substrate;

epitaxially growing an optical waveguide containing an active layer at an area between the pair of stripe masks;

removing the stripe masks to form a growth blocking mask on the optical waveguide;

epitaxially growing a first electrical conduction type current blocking layer and a second electrical conduction type current blocking layer at an area other than the growth blocking mask sequentially;

inverting part of the second electrical conduction type current blocking layer to a first electrical conduction type;

epitaxially growing a first electrical conduction type semiconductor layer on the second electrical conduction type current blocking layer; and epitaxially growing a second electrical conduction type semiconductor layer over an entire surface after the growth blocking mask is removed.

According to the present invention, there is provided a photosemiconductor device, in which a second electrical conduction type semiconductor layer is formed on a first electrical conduction type semiconductor substrate; an optical waveguide containing an active layer is directly formed thereon by selective growth process, a lateral surface of the optical waveguide is buried with a semiconductor multilayer structure containing a first electrical conduction type semiconductor layer and an additional second electrical conduction type semiconductor layer; and the second electrical conduction type semiconductor layer is inverted to a first electrical conduction type at an area corresponding to the optical waveguide.

According to the present invention, there is provided a method of fabricating a photosemicoductor device, comprising steps of:

epitaxially growing a second electrical conduction type semiconductor layer on a first electrical conduction type semiconductor substrate;

forming a pair of stripe masks on the second electrical conduction type semiconductor layer;

inverting the second electrical conduction type semiconductor layer to a first electrical conduction type at an area between the pair of stripe masks;

epitaxially growing an optical waveguide containing an active layer at an area between the pair of stripe masks;

removing the stripe masks to form a growth blocking mask on the optical waveguide;

epitaxially growing a first electrical conduction type current blocking layer at an area other than the growth blocking mask;

epitaxially growing an additional second electrical conduction type semiconductor layer over an entire surface after the growth blocking mask is removed.

In an embodiment of the present invention, the first electrical conduction type is p-type and the second electrical conduction type is n-type.

According to the present invention, the optical waveguide is directly formed according to the MOVPE selective growth method without using the etching process and, further, a current blocking structure is introduced. In this structure, since the layers 32, 33, 34 constituting an optical waveguide is formed according to the MOVPE selective growth method, the process of etching the semiconductor layer is not necessary. Therefore, it becomes possible to suppress the variance of processes to very low, which has been caused by the difference in temperature, concentration or manner of agitation of the etchant during the etching of the semiconductor layer. Further, in the structure of the optical waveguide directly formed by the MOVPE selective growth, since the lateral surface of the waveguide is formed by a specific crystal plane, a very smooth surface such as a mirror surface results. In consequence, as compared with the optical waveguide which has been formed by the conventional etching process, the scattering loss of the guided light can be suppressed to low. As described above, if the MOVPE selective growth method is used, an optical waveguide very low in loss can be fabricated with good uniformity and reliability or reproducibility and with good yield.

The present invention provides a semiconductor device in which both sides of the optical waveguide including the active layer made by MOVPE selective growth are buried with the pnpn current blocking structure, the semiconductor device comprising a structure preventing the n-n interconnection by using the method of Zn open tube diffusion which is carried out in the MOVPE system. Therefore, the optical semiconductor device small in leakage current (reactive current) can be realized with good reliability or reproducibility and with good yield.

DESCRIPTION OF THE PREFERRED EMBODIMENTS

Next, the present invention is described with reference to the accompanying drawings.

Figure 1A:
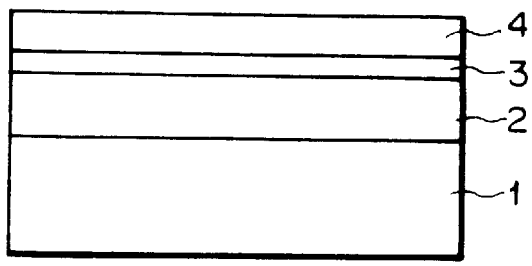
FIGS. 1A to 1D are each a cross-sectional view for explaining the fabrication process of the first and second conventional semiconductor lasers.
Figure 1B:
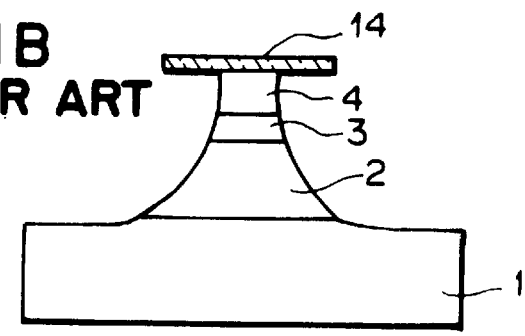
Figure 1C:
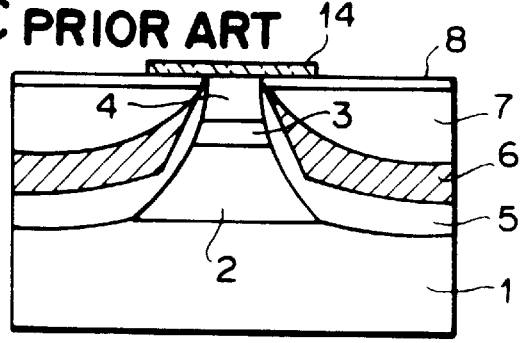
Figure 1D:
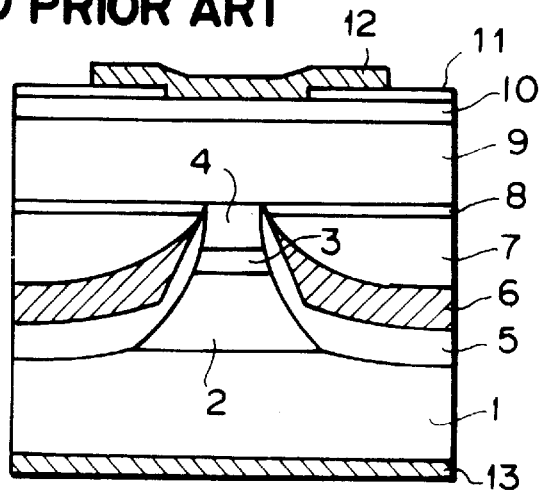
Figure 2A:
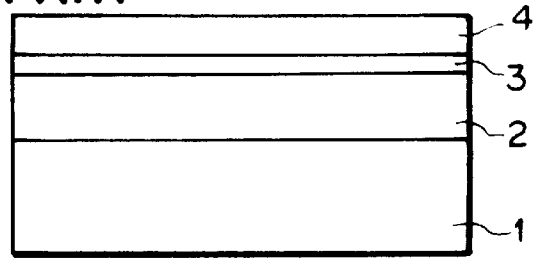
FIGS. 2A to 2D are each a cross-sectional view for explaining the fabrication process of the third conventional semiconductor laser.
Figure 2B:
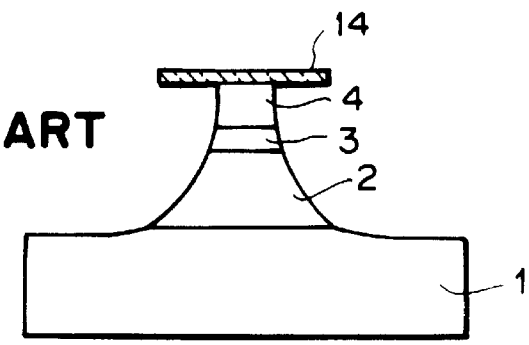
Figure 2C:
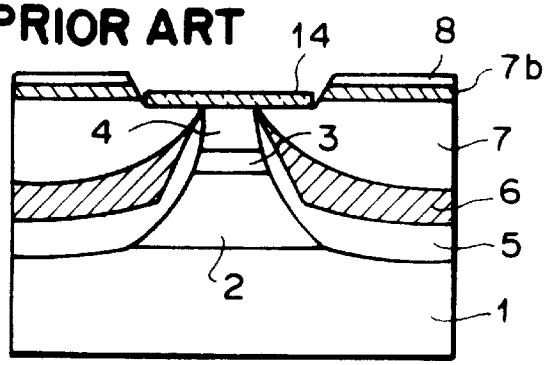
Figure 2D:
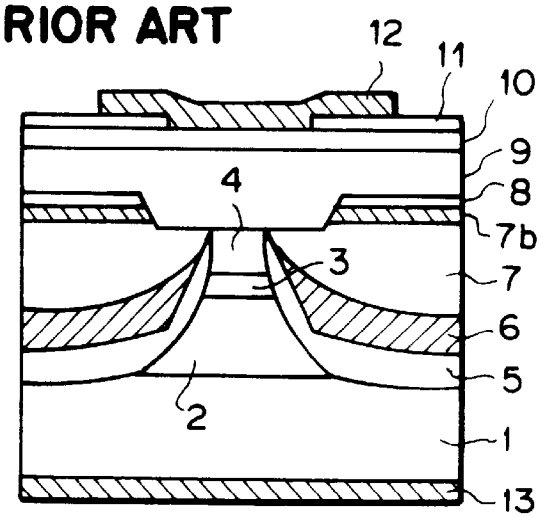
Figure 3A:
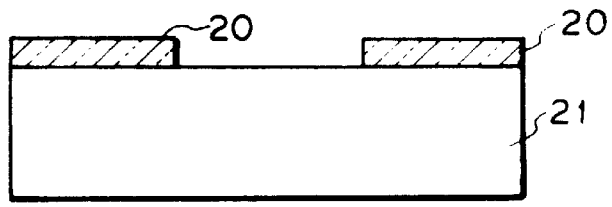
FIGS. 3A to 3D are each a cross-sectional view for explaining the fabrication process of the fourth conventional semiconductor laser.
Figure 3B:
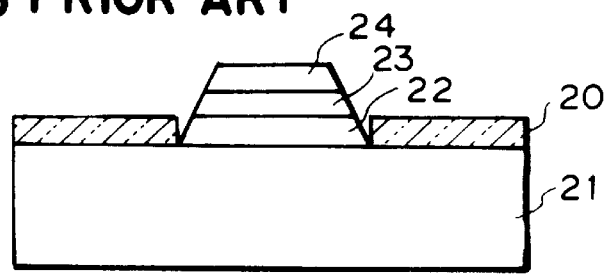
Figure 3C:
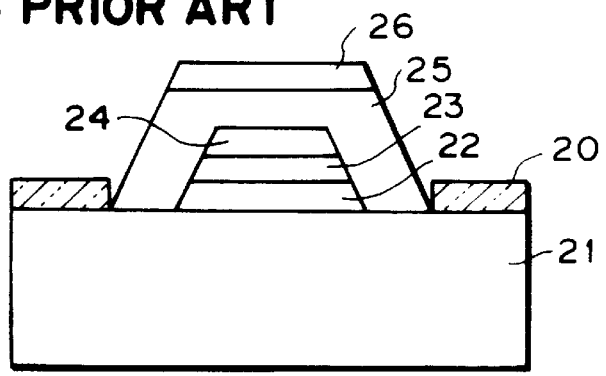
Figure 3D:
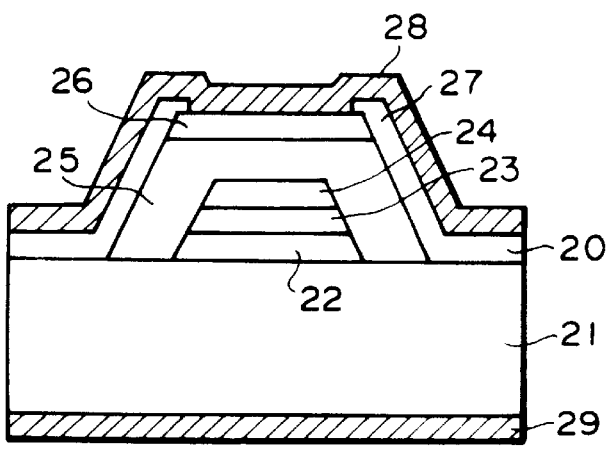
Figure 4:
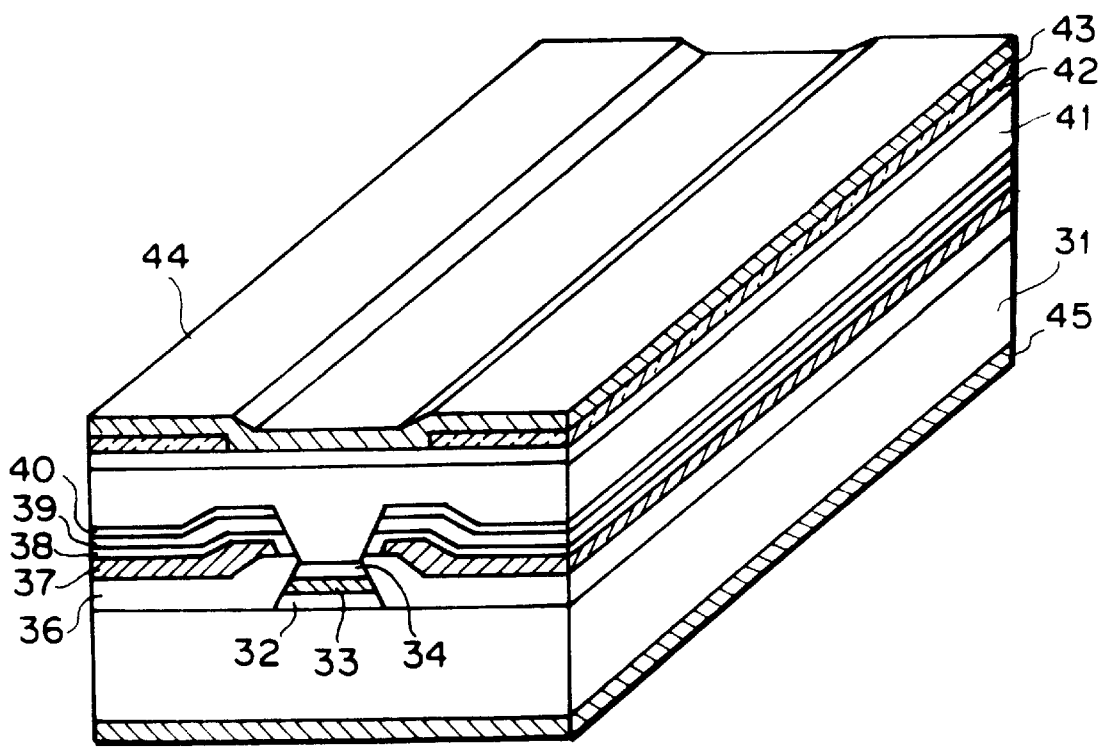
FIG. 4 is a perspective view of the semiconductor laser of a first embodiment of the present invention.

A first embodiment of the present invention is described with reference to FIGS. 4 and 5A to 5F. FIGS. 5A to 5F are each a cross-sectional view for explaining the fabrication process of the first embodiment of the semiconductor laser, and FIG. 4 is a perspective view of the semiconductor laser fabricated according to the process of FIGS. 5A to 5F.

Figure 5A:
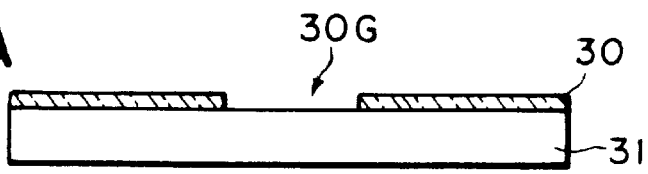
FIGS. 5A to 5F are each a cross-sectional view for explaining the fabrication process of the first embodiment.

First, as shown in FIG. 5A, $SiO_2$ is deposited on a p-InP substrate 31 according to the CVD method, and patterned so that the stripe is oriented to the direction of <011>of the p-InP substrate 31 to form an $SiO_2$ mask 30. Here, the mask 30 has a gap 30G, and the width of the gap 30G is 1.5 $\mu$m and the width of the mask 30 is 10 $\mu$m.

Figure 5B:
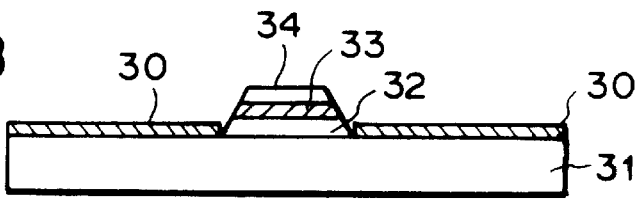

Next, as shown in FIG. 5B, a 0.2 $\mu$m thick p-InP clad layer (carrier density of $7\times10^{17}$ cm$^{-3}$) 32, 0.2 $\mu$m thick undoped InGaAsP/InGaAsP multiple quantum well (MQW) active layer (wavelength of 1.3 $\mu$m) and 0.2 $\mu$m thick n-InP clad layer 34 are epitaxially grown on the substrate 31 at an area corresponding to the mask gap 30G by MOVPE selective growth. Here, the active layer 33 may be an undoped InGaAs/InGaAsP MQW active layer or an undoped InGaAsP bulk active layer, and is not limited to the InGaAsP/InGaAsP MQW structure. The lateral surface of double hetero (DH) structure of the layers 32, 33, 34 formed by the MOVPE selective growth is made to have a very smooth mirror surface structure, because the (111)B plane is automatically formed on the basis of the dependence of the MOVPE growth rate on the planar orientation. As a result, the scattering loss of the waveguide of the DH structure can be suppressed to extremely low.

Figure 5C:
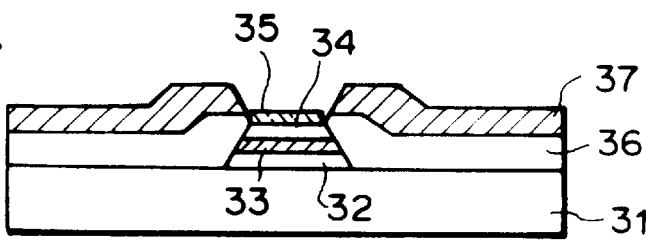
Figure 5D:
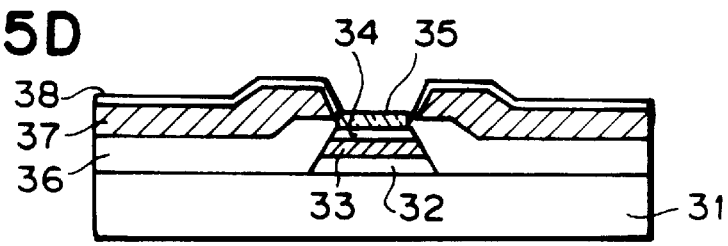
Figure 5E:
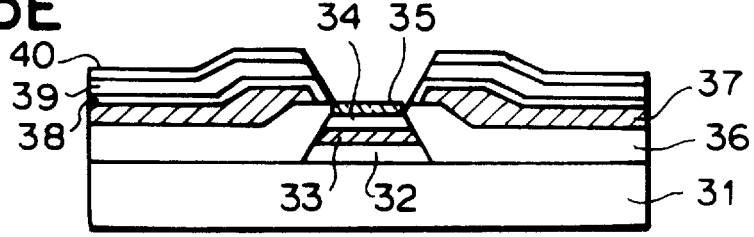

Thereafter, as shown in FIG. 5C, a $SiO_2$ mask 35 is formed on the n-InP clad layer 34, and both sides of the DH structure is buried with a 0.5 $\mu$m thick p-InP layer (carrier density of $7\times10^{17}$ cm$^{-3}$) 36 and a 0.7 $\mu$m thick n-InP layer (carrier density of $1\times10^{18}$ cm$^{-3}$) 37. In this state, the growth is stopped once and 100 sccm of $PH_3$ and 100 sccm of dietyl zinc (DEZn) are supplied during 60 seconds, then, as shown in FIG. 5D, a 0.1 to 0.2 $\mu$m thick p-type inversion layer 38 is formed on the surface of the n-InP layer 37. Subsequently, as shown in FIG. 5E, a 0.5 $\mu$m thick p-InP layer (carrier density of $7\times10^{17}$ cm$^{-3}$) 39 and a 0.2 $\mu$m thick n-InP layer (carrier density of $1\times10^{18}$ cm$^{-3}$) 40 are grown. The n-InP layer 40 is provided in order to prevent formation of the pn junction on the growth interface, and is not always necessary in the present invention.

Figure 5F:
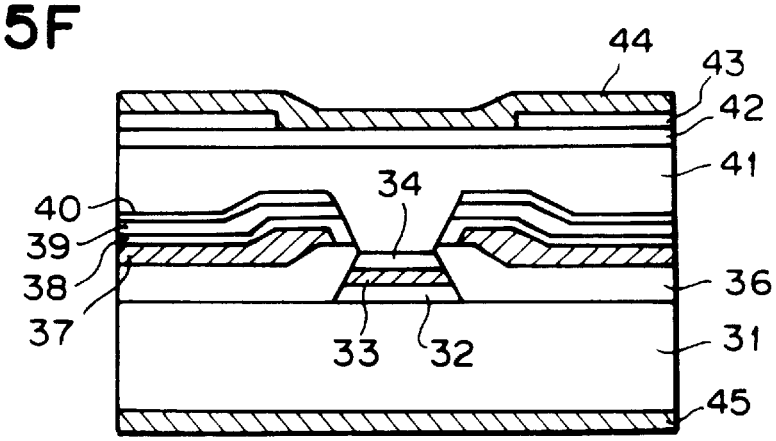

Next, after the $SiO_2$ mask 35 is removed, the structure is buried with a 1.5 $\mu$m thick n-InP layer (carrier density of $5\times10^{18}$ cm$^{-3}$) 41 and a 0.3 $\mu$m thick n-InGaAsP cap layer (carrier density of $5\times10^{18}$ cm$^{-3}$) 42. Finally, as shown in FIG. 5F, the process of forming an insulation film 43, n-electrode 44 and p-electrode 45 are carried out to obtain the laser structure shown in FIG. 4.

The semiconductor laser fabricated according to this embodiment was cut into pieces, each of which was 150 $\mu$m length. A high reflection film having a reflectivity of 80% was coated on the front end facet and another high reflection film having a reflectivity of 95% was coated on the rear end facet. After measurement, it was found that the device showed a laser oscillation wavelength of 1.30 $\mu$m, threshold current of 1.0 mA and slope efficiency of 0.50 W/A. The device could be obtained with a high yield.

Here, the principle of operation of the current blocking structure according to the present invention is described. When a pnpn current blocking structure is introduced to both sides of the waveguide including the layers 32, 33, 34 formed by MOVPE selective growth, if the n-InP current blocking layer 37 and the n-InP clad layer 34 come into contact, they do not function as the current blocking structure. Therefore, in the present invention, part of the n-InP current blocking layer 37 is inverted to p-type by the open tube diffusion of Zn to prevent the n-InP blocking layer 37 and the n-InP clad layer 34 from contacting each other. In this method, since the MOVPE growth of the current blocking layer and the Zn diffusion can be carried out in the same process, any problem such as the increase of the number of growth steps does not occur.

Figure 10:
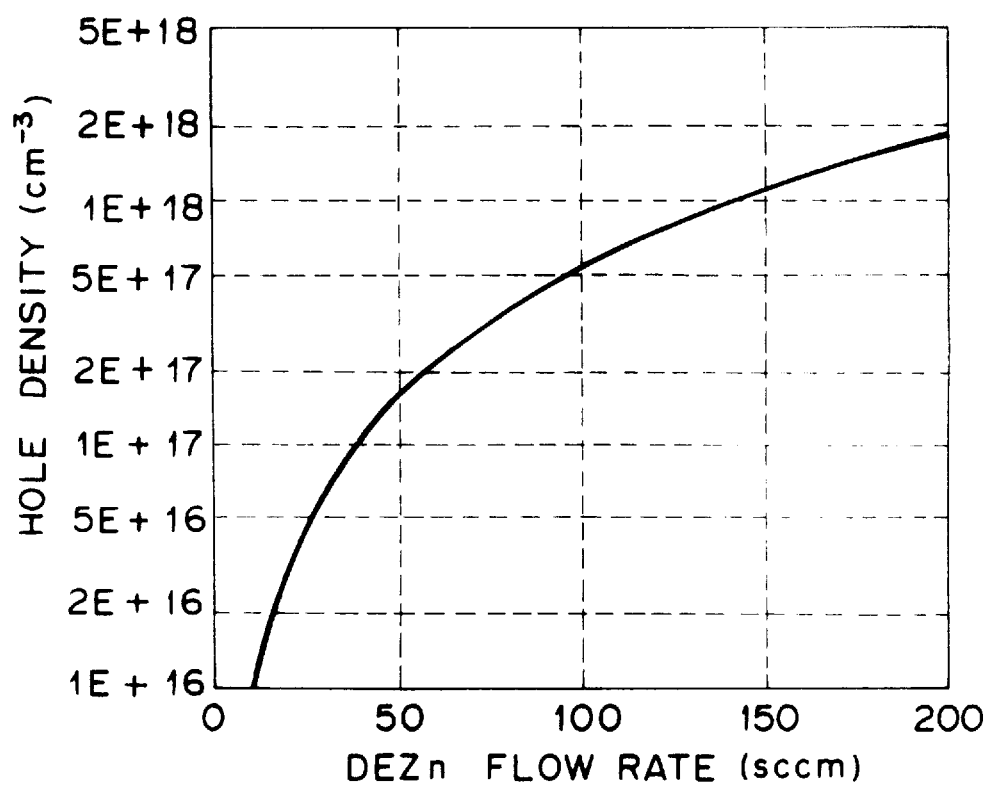
FIGS. 10 and 11 each show the experimental result obtained with Zn diffusion into InP substrate.
Figure 11:
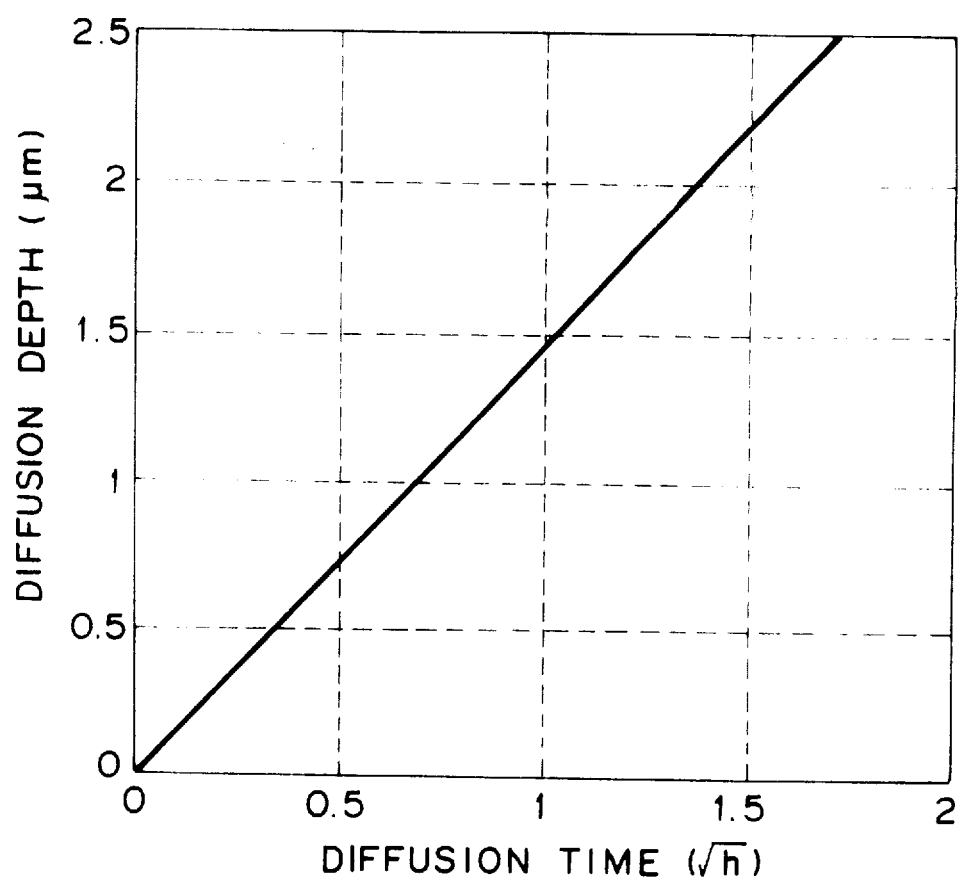

The Zn diffusion is described with reference to FIGS. 10 and 11. If diethyl zinc (DEZn) or dimethyl zinc (DMZn), which is a Zn dopant, is supplied into the MOVPE system at phosphine ($PH_3$) gas atmosphere, then Zn diffusion into the crystal occurs. As shown in FIG. 10, the Zn diffusion density, i.e. the hole density, can be controlled by the DEZn flow rate. On the other hand, the diffusion depth can be controlled by the diffusion time, as shown in FIG. 11. FIGS. 10 and 11 each show the experimental result obtained with the Zn diffusion into the InP substrate of the carrier density $n=2\times10^{18}$ $cm^{-3}$ at the temperature of 600 degrees Centigrade and the $PH_3$ flow rate of 100 sccm. Incidentally, C-V method was used to measure the hole density. Since the above diffusion temperature and $PH_3$ flow rate are the same as those at which the MOVPE crystal growth is carried out, it is possible to carry out the crystal growth, then stop the growth to carry out the Zn diffusion and, after the diffusion is completed, then carry out the crystal growth again in the same system.

Figure 6:
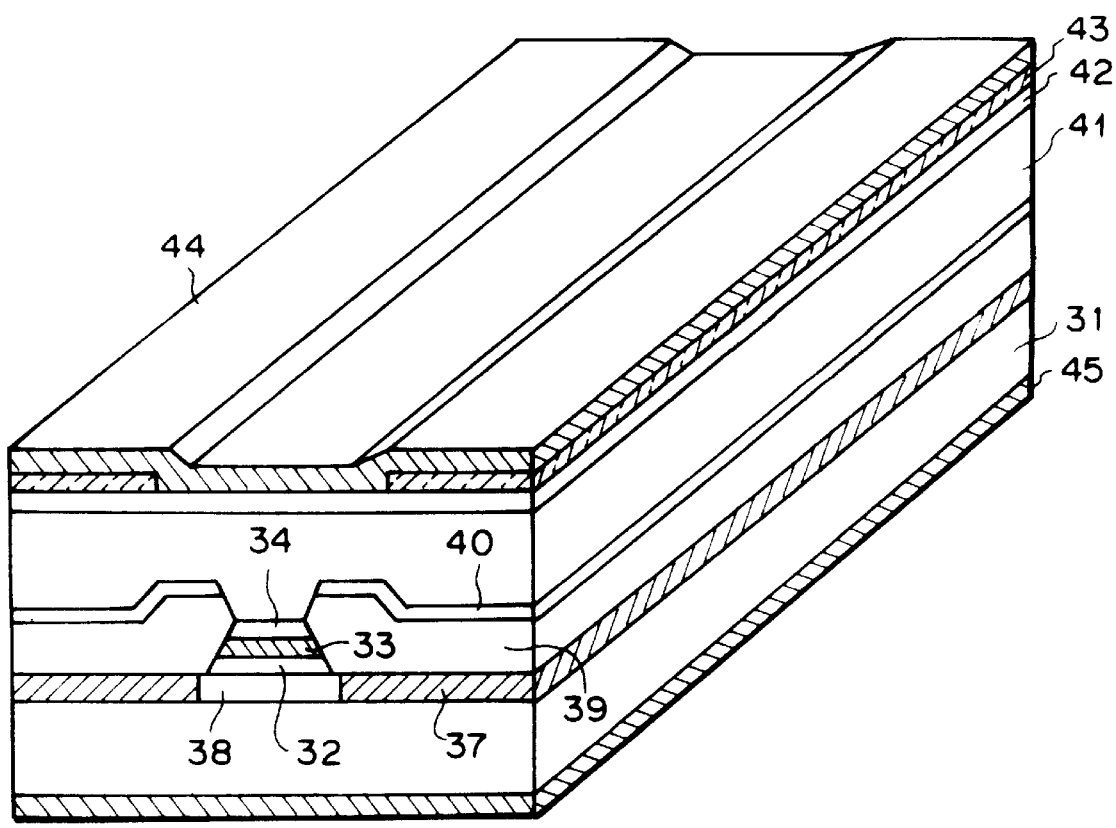
FIG. 6 is a perspective view of the semiconductor laser of a second embodiment of the present invention.

A second embodiment of the present invention is described with reference to FIGS. 6 and 7A to 7F. FIGS. 7A to 7F are each a cross-sectional view for explaining the fabrication process of the second embodiment of the semiconductor laser, and FIG. 6 is a perspective view of the semiconductor laser fabricated according to the process of FIGS. 7A to 7F.

Figure 7A:
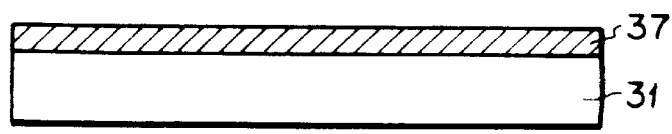
FIGS. 7A to 7F are each a cross-sectional view for explaining the fabrication process of the second embodiment.
Figure 7B:
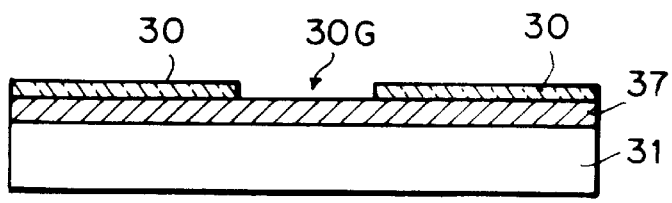

First, as shown in FIG. 7A, a 0.5 $\mu$m thick n-InP layer (carrier density of $1\times10^{18}$ $cm^{-3}$) 37 is grown over the entire surface of a p-InP substrate 31. Next, as shown in FIG. 7B, $SiO_2$ is deposited on the n-InP layer 37 according to the CVD process, and patterned so that the stripe is oriented to the direction of <011> of the p-InP substrate 31 to form an $SiO_2$ mask 30. Here, the mask 30 has a gap 30G, and the width of the gap 30G is 1.5 $\mu$m and the width of the mask 30 is 10 $\mu$m.

Figure 7C:
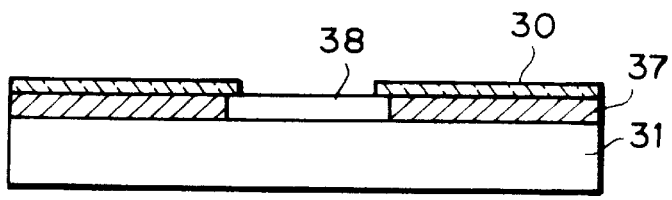

Next, 100 sccm of $PH_3$ and 100 sccm of DEZn are supplied during 15 minutes at a temperature of 600 degrees Centigrade in the MOVPE system, then, as shown in FIG. 7C, a p-type inversion layer 38 is formed in the n-InP layer 37 at an area corresponding to the mask gap 30G.

Figure 7D:
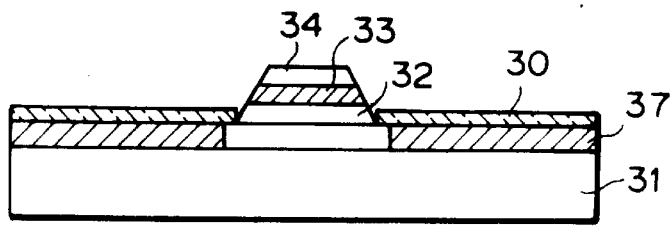

Next, as shown in FIG. 7D, in analogous manner to the first embidiment, a 0.2 $\mu$m thick p-InP clad layer (carrier density of $7\times10^{17}$ $cm^{-3}$) 32, 0.2 $\mu$m thick undoped InGaAsP/InGaAsP multiple quantum well (MQW) active layer (wavelength of 1.3 $\mu$m) and 0.2 $\mu$m thick n-InP clad layer 34 are epitaxially grown on the p-type inversion layer 38 at an area corresponding to the mask gap 30G by MOVPE selective growth. Here, the active layer 33 may be an undoped InGaAs/InGaAsP MQW active layer or an undoped InGaAsP bulk active layer, and is not limited to the InGaAsP/InGaAsP MQW structure. The lateral surface of double hetero (DH) structure of the layers 32, 33, 34 formed by the MOVPE selective growth is made to have a very smooth mirror surface structure, because the (111)B plane is automatically formed on the basis of the dependence of the MOVPE growth rate on the planar orientation. As a result, the scattering loss of the waveguide of the DH structure can be suppressed to extremely low.

Figure 7E:
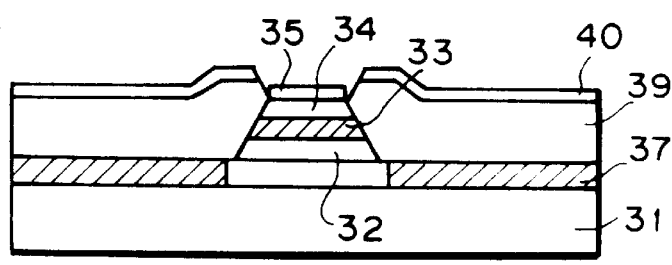

Next, as shown in FIG. 7E, a $SiO_2$ mask 35 is formed on the n-InP clad layer 34, and both sides of the DH structure is buried with a 0.7 $\mu$m thick p-InP layer (carrier density of $7\times10^{17}$ $cm^{-3}$) 39 and a 0.2 $\mu$m thick n-InP layer (carrier density of $1\times10^{18}$ $cm^{-3}$) 40. The n-InP layer 40 is provided in order to prevent formation of the pn junction on the growth interface, and is not always necessary in the present invention.

Figure 7F:
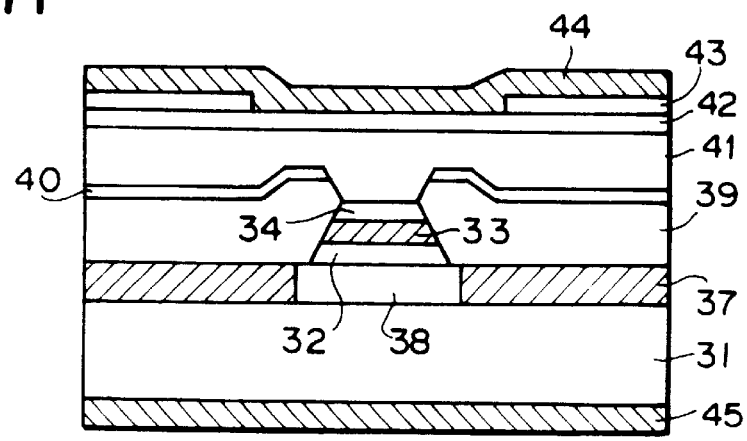

Next, after the $SiO_2$ mask 35 is removed, the structure is buried with a 1.5 $\mu$m thick n-InP layer (carrier density of $1\times10^{18}$ $cm^{-3}$) 41 and a 0.3 $\mu$m thick n-InGaAsP cap layer (carrier density of $5\times10^{18}$ $cm^{-3}$) 42. Finally, as shown in FIG. 7F, the process of forming an insulation film 43, n-electrode 44 and p-electrode 45 are carried out to obtain the laser structure shown in FIG. 6.

The semiconductor laser fabricated according to this embodiment was cut into pieces, each of which was 150 $\mu$m length. A high reflection film having a reflectivity of 80% was coated on the front end facet and another high reflection film having a reflectivity of 95% was coated on the rear end facet. After measurement, it was found that the device showed a laser oscillation wavelength of 1.30 $\mu$m, threshold current of 1.0 mA and slope efficiency of 0.50 W/A. The device could be obtained with a high yield.

A third embodiment of the present invention is described with reference to FIGS. 8A to 8F. FIGS. 8A to 8F are each a cross-sectional view for explaining the fabrication process of the third embodiment of the semiconductor laser.

Figure 8A:
FIGS. 8A to 8F are each a cross-sectional view for explaining the fabrication process of a third embodiment of the present invention.

First, as shown in FIG. 8A, $SiO_2$ is deposited on a p-InP substrate 31 according to the CVD method, and patterned so that the stripe is oriented to the direction of <011> of the p-InP substrate 31 to form an $SiO_2$ mask 30. Here, the mask 30 has a gap 30G, and the width of the gap 30G is 1.5 $\mu$m and the width of the mask 30 is 10 $\mu$m.

Figure 8B:
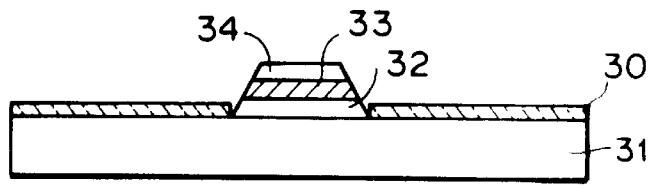

Next, as shown in FIG. 8B, a 0.2 $\mu$m thick p-InP clad layer (carrier density of $7\times10^{17}$ $cm^{-3}$) 32, 0.2 $\mu$m thick undoped InGaAsP/InGaAsP multiple quantum well (MQW) active layer (wavelength of 1.3 $\mu$m) and 0.2 $\mu$m thick n-InP clad layer 34 are epitaxially grown on the substrate 31 at an area corresponding to the mask gap 30G by MOVPE selective growth. Here, the active layer 33 may be an undoped InGaAs/InGaAsP MQW active layer or an undoped InGaAsP bulk active layer, and is not limited to the InGaAsP/InGaAsP MQW structure. The lateral surface of double hetero (DH) structure of the layers 32, 33, 34 formed by the MOVPE selective growth is made to have a very smooth mirror surface structure, because the (111)B plane is automatically formed on the basis of the dependence of the MOVPE growth rate on the planar orientation. As a result, the scattering loss of the waveguide of the DH structure can be suppressed to extremely low.

Figure 8C:
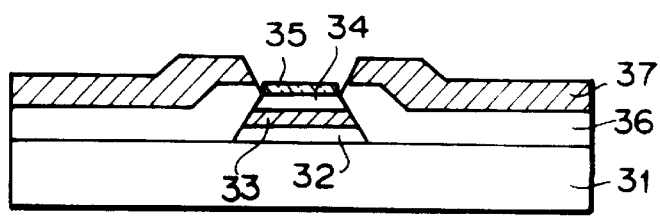
Figure 8D:
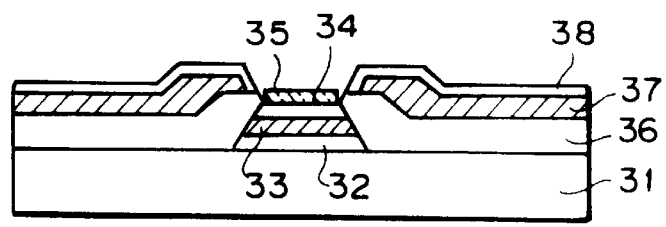
Figure 8E:
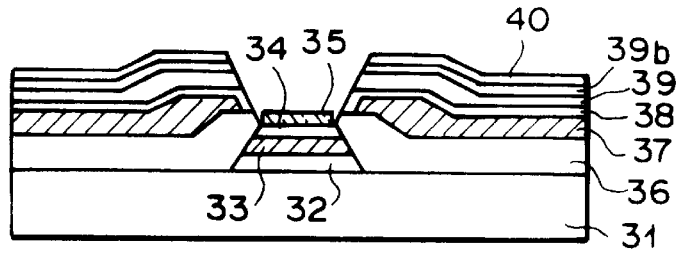

Thereafter, as shown in FIG. 8C, a $SiO_2$ mask 35 is formed on the n-InP clad layer 34, and both sides of the DH structure is buried with a 0.5 $\mu$m thick p-InP layer (carrier density of $7\times10^{17}$ $cm^{-3}$) 36 and a 0.7 $\mu$m thick n-InP layer (carrier density of $1\times10^{18}$ $cm^{-3}$) 37. In this state, the growth is stopped once and 100 sccm of $PH_3$ and 100 sccm of dietyl zinc (DEZn) are supplied during 60 seconds, then, as shown in FIG. 8D, a 0.1 to 0.2 $\mu$m thick p-type inversion layer 38 is formed on the surface of the n-InP layer 37. Subsequently, as shown in FIG. 8E, a 0.5 $\mu$m thick p-InP layer (carrier density of $7\times10^{17}$ $cm^{-3}$) 39, a 0.1 $\mu$m thick undoped InGaAsP layer (bandgap wavelength of 1.2 $\mu$m) 39b and a 0.2 $\mu$m thick n-InP layer (carrier density of $1\times10^{18}$ $cm^{-3}$) 40 are grown. The n-InP layer 40 is provided in order to prevent formation of the pn junction on the growth interface, and is not always necessary in the present invention.

Figure 8F:
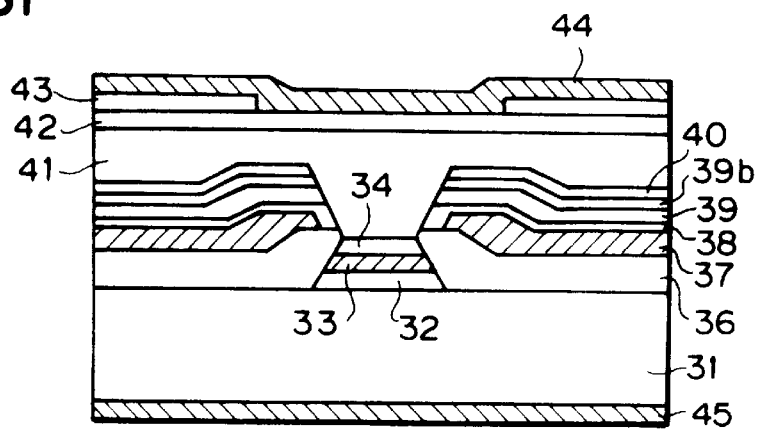

Next, after the $SiO_2$ mask 35 is removed, the structure is buried with a 1.5 $\mu$m thick n-InP layer (carrier density of $1\times10^{18}$ $cm^{-3}$) 41 and a 0.3 $\mu$m thick n-InGaAsP cap layer (carrier density of $5\times10^{18}$ $cm^{-3}$) 42. Finally, as shown in FIG. 8F, the process of forming an insulation film 43, n-electrode 44 and p-electrode 45 are carried out to obtain the laser structure.

The semiconductor laser fabricated according to this embodiment was cut into pieces, each of which was 150 μm length. A high reflection film having a reflectivity of 80% was coated on the front end facet and another high reflection film having a reflectivity of 95% was coated on the rear end facet. After measurement, it was found that the device showed a laser oscillation wavelength of 1.30 μm, and showed a threshold current of 0.8 mA and slope efficiency of 0.50 W/A at the temperature of 20 degrees Centigrade and a threshold current of 4.5 mA and slope efficiency of 0.40 W/A at the temperature of 85 degrees Centigrade. The device could be obtained with a high yield.

A fourth embodiment of the present invention is described with reference to FIGS. 9A to 9F. FIGS. 9A to 9F are each a cross-sectional view for explaining the fabrication process of the fourth embodiment of the semiconductor laser.

Figure 9A:
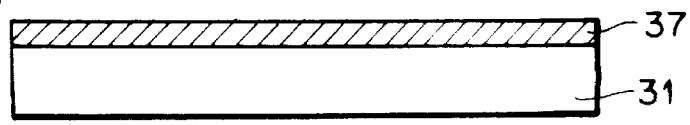
FIGS. 9A to 9F are each a cross-sectional view for explaining the fabrication process of a fourth embodiment of the present invention.
Figure 9B:
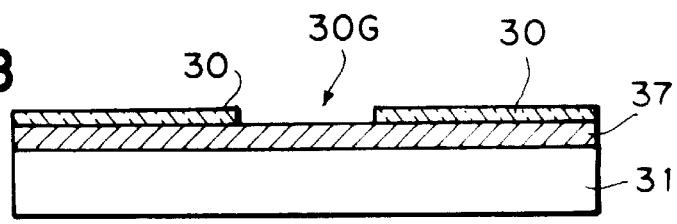

First, as shown in FIG. 9A, a 0.5 μm thick n-InP layer (carrier density of $1 \times 10^{18}$ cm$^{-3}$) 37 is grown over the entire surface of a p-InP substrate 31. Next, as shown in FIG. 9B, SiO$_2$ is deposited on the n-InP layer 37 according to the CVD process, and patterned so that the stripe is oriented to the direction of <011> of the p-InP substrate 31 to form an SiO$_2$ mask 30. Here, the mask 30 has a gap 30G, and the width of the gap 30G is 1.5 μm and the width of the mask 30 is 10 μm.

Figure 9C:
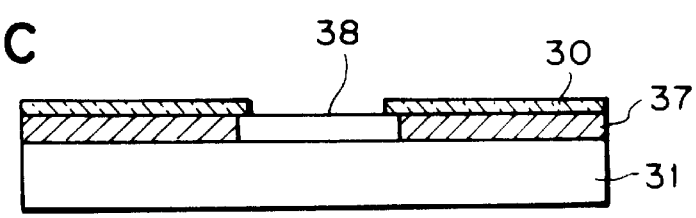

Next, 100 sccm of PH$_3$ and 100 sccm of DEZn are supplied during 15 minutes at a temperature of 600 degrees Centigrade in the MOVPE system, then, as shown in FIG. 9C, a p-type inversion layer 38 is formed in the n-InP layer 37 at an area corresponding to the mask gap 30G.

Figure 9D:
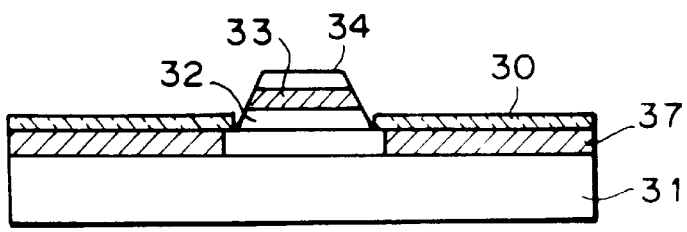

Next, as shown in FIG. 9D, in analogous manner to the first embidiment, a 0.2 μm thick p-InP clad layer (carrier density of $7 \times 10^{17}$ cm$^{-3}$) 32, 0.2 μm thick undoped InGaAsP/InGaAsP multiple quantum well (MQW) active layer (wavelength of 1.3 μm) and 0.2 μm thick n-InP clad layer 34 are epitaxially grown on the p-type inversion layer 38 at an area corresponding to the mask gap 30G by MOVPE selective growth. Here, the active layer 33 may be an undoped InGaAs/InGaAsP MQW active layer or an undoped InGaAsP bulk active layer, and is not limited to the InGaAsP/InGaAsP MQW structure. The lateral surface of double hetero (DH) structure of the layers 32, 33, 34 formed by the MOVPE selective growth is made to have a very smooth mirror surface structure, because the (111)B plane is automatically formed on the basis of the dependence of the MOVPE growth rate on the planar orientation. As a result, the scattering loss of the waveguide of the DH structure can be suppressed to extremely low.

Figure 9E:
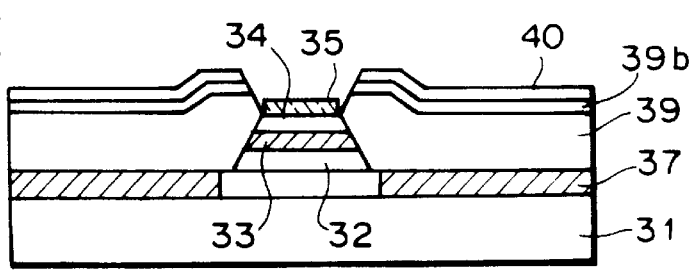

Next, as shown in FIG. 9E, a SiO$_2$ mask 35 is formed on the n-InP clad layer 34, and both sides of the DH structure is buried with a 0.7 μm thick p-InP layer (carrier density of $7 \times 10^{17}$ cm$^{-3}$) 39, a 0.1 μm thick undoped InGaAsP layer (bandgap wavelength of 1.2 μm) 39b and a 0.2 μm thick n-InP layer (carrier density of $1 \times 10^{18}$ cm$^{-3}$) 40. The n-InP layer 40 is provided in order to prevent formation of the pn junction on the growth interface, and is not always necessary in the present invention.

Figure 9F:
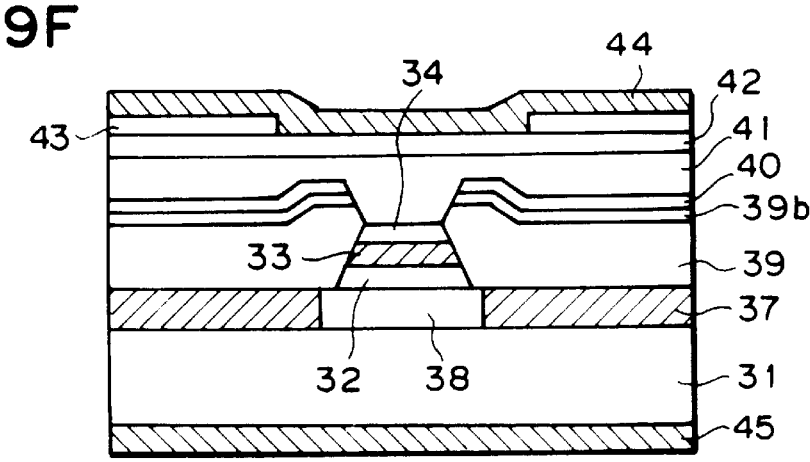

Next, after the SiO$_2$ mask 35 is removed, the structure is buried with a 1.5 μm thick n-InP layer (carrier density of $1 \times 10^{18}$ cm$^{31\ 3}$) 41 and a 0.3 μm thick n-InGaAsP cap layer (carrier density of $5 \times 10^{18}$ cm$^{-3}$) 42. Finally, as shown in FIG. 9F, the process of forming an insulation film 43, n-electrode 44 and p-electrode 45 are carried out to obtain the laser structure.

The semiconductor laser fabricated according to this embodiment was cut into pieces, each of which was 150 μm length. A high reflection film having a reflectivity of 80% was coated on the front end facet and another high reflection film having a reflectivity of 95% was coated on the rear end facet. After measurement, it was found that the device showed a laser oscillation wavelength of 1.30 μm, and showed a threshold current of 0.8 mA and slope efficiency of 0.50 W/A at the temperature of 20 degrees Centigrade and a threshold current of 4.5 mA and slope efficiency of 0.40 W/A at the temperature of 85 degrees Centigrade. The device could be obtained with a high yield.

Although, in the foregoing embodiments, only the laser of the 1.3 μm order wavelength was described, a similar laser structure of 1.0 to 1.7 μm wavelength can be realized with the InGaAsP series. Further, although, in the above embodiments, description was made only as to the application of the semiconductor laser, the present invention can be applied not only to the semiconductor laser, but to other devices such as optical amplifiers or optical switches requiring the current blocking structure.

What is claimed is:

1. A photosemiconductor device, comprising:
   an optical waveguide formed on a first electrical conduction type semiconductor substrate; and
   a current blocking structure positioned adjacent to said optical waveguide, said current blocking structure comprising a first, first electrical conduction type semiconductor layer formed on said substrate, a second electrical conduction type semiconductor layer formed thereon, a first electrical conduction type inversion semiconductor layer which is obtained by inverting an electrical conduction type of a surface of said second electrical conduction type semiconductor layer, and a second, first electrical conduction type semiconductor layer formed thereon,
   wherein said first, first electrical conduction type semiconductor layer and said inversion semiconductor layer are in contact with each other, thereby said second electrical conduction type semiconductor layer is separated from said optical waveguide, wherein the optical waveguide has a lateral surface of a (111)B plane.

2. A photosemiconductor device as set forth in claim 1, wherein said optical waveguide comprises a first electrical conduction type clad layer formed on said substrate, an active layer formed thereon and a second electrical conduction type clad layer formed thereon.

3. A photosemiconductor device as set forth in claim 1, wherein said first electrical conduction type is p-type and said second electrical conduction type is n-type.

4. A photosemiconductor device, comprising:
   a second electrical conduction type semiconductor layer formed on a first electrical conduction type semiconductor substrate;
   a first electrical conduction type inversion semiconductor layer which is obtained by inverting an electrical conduction type of a partial area of said second electrical conduction type semiconductor layer;
   an optical waveguide formed on said inversion semiconductor layer; and
   a current blocking structure positioned adjacent to said optical waveguide, said current blocking structure comprising said a inversion semiconductor layer, said second electrical conduction type semiconductor layer and a first electrical conduction type layer formed thereon,
   wherein said first electrical conduction type semiconductor layer and said inversion semiconductor layer are in contact with each other, thereby said second electrical conduction type semiconductor layer is separated from said optical waveguide, wherein the optical waveguide has a lateral surface of a (111)B plane.

5. A photosemiconductor device as set forth in claim 4, wherein said optical waveguide comprises a first electrical conduction type clad layer formed on said inversion semiconductor layer, an active layer formed thereon and a second electrical conduction type clad layer formed thereon.

6. A photosemiconductor device as set forth in claim 4, wherein said first electrical conduction type is p-type and said second electrical conduction type is n-type.

7. A photosemiconductor device, in which an optical waveguide containing an active layer is directly formed on a first electrical conduction type semiconductor substrate by selective growth; a lateral surface of said optical waveguide is buried with a semiconductor multilayer structure containing a first electrical conduction type semiconductor layer and a second electrical conduction type semiconductor layer; a partial area of said second electrical conduction type semiconductor layer is inverted to a first electrical conduction type; and the lateral surface of the optical waveguide comprises a (111)B plane.

8. A photosemiconductor device as set forth in claim 7, wherein said first electrical conduction type is p-type and said second electrical conduction type is n-type.

9. The photosemiconductor device as set forth in claim 7, wherein said optical waveguide comprises a first electrical conduction type clad layer formed on said substrate, the active layer formed thereon and a second electrical conduction type clad layer formed thereon.

10. A photosemiconductor device, in which a second electrical conduction type semiconductor layer is formed on a first electrical conduction type semiconductor substrate; an optical waveguide containing an active layer is directly formed thereon by selective growth process, a lateral surface of said optical waveguide is buried with a semiconductor multilayer structure containing a first electrical conduction type semiconductor layer and an additional second electrical conduction type semiconductor layer; said second electrical conduction type semiconductor layer is inverted to a first electrical conduction type at an area corresponding to said optical waveguide; and the lateral surface of the optical waveguide comprises a (111)B plane.

11. A photosemiconductor device as set forth in claim 10, wherein said first electrical conduction type is p-type and said second electrical conduction type is n-type.

12. The photosemiconductor device as set forth in claim 10, wherein said optical waveguide comprises a first electrical conduction type clad layer formed on the area where said second electrical conduction type semiconductor layer is inverted to the first electrical conduction type, the active layer formed thereon and a second electrical conduction type clad layer formed thereon.

* * * * *

UNITED STATES PATENT AND TRADEMARK OFFICE
CERTIFICATE OF CORRECTION

PATENT NO. : 5,847,415
DATED : December 08, 1998
INVENTOR(S) : Yasutaka SAKATA

It is certified that error appears in the above-identified patent and that said Letters Patent is hereby corrected as shown below:

Column 9, Line 63, delete "$1 \times 10^{18}$ cm $^{31}$ $^3$" and insert -- $1 \times 10^{18}$ cm$^{-3}$ --

Signed and Sealed this

Sixth Day of July, 1999

*Attest:*

Q. TODD DICKINSON

*Attesting Officer*     Acting Commissioner of Patents and Trademarks